(12) United States Patent
Stengel et al.

(10) Patent No.: US 6,768,378 B2
(45) Date of Patent: Jul. 27, 2004

(54) DISTRIBUTED RF POWER AMPLIFIER WITH LOAD COMPENSATION

(75) Inventors: Robert E. Stengel, Pompano Beach, FL (US); Scott A. Olson, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/017,986

(22) Filed: Dec. 13, 2001

(65) Prior Publication Data

US 2003/0112067 A1 Jun. 19, 2003

(51) Int. Cl.$^7$ ................................................. H03F 3/60
(52) U.S. Cl. ........................................ 330/54; 330/286
(58) Field of Search ...................... 330/53, 54, 124 R, 330/286, 295, 84

(56) References Cited

U.S. PATENT DOCUMENTS

| | | | | |
|---|---|---|---|---|
| 4,540,954 A | * | 9/1985 | Apel | 330/286 |
| 4,701,716 A | * | 10/1987 | Poole | 330/43 |
| 4,733,195 A | * | 3/1988 | Tserng et al. | 330/286 |
| 5,365,197 A | * | 11/1994 | Ikalainen | 330/286 |
| 6,433,840 B1 | | 8/2002 | Pavio et al. | |

* cited by examiner

*Primary Examiner*—Henry Choe

(57) ABSTRACT

A radio frequency power amplifier circuit according to certain embodiments of the present invention uses a distributed radio frequency amplifier 110 having a plurality of stages each with an input. The distributed radio frequency amplifier 110 drives an output load, such as an antenna 114. A drive signal synthesizer 106, having a plurality of outputs, drives the plurality of inputs to the distributed amplifier 110. Changes in load impedance are measured, e.g., using a directional coupler 160, and the measurement is used to change a drive signal produced by the drive signal synthesizer 106 to compensate for the change in load impedance.

42 Claims, 6 Drawing Sheets

DISTRIBUTED RF POWER AMPLIFIER WITH LOAD COMPENSATION

FIELD OF THE INVENTION

This invention relates generally to the field of radio frequency power amplifiers. More particularly, certain embodiments of this invention relate to a distributed RF power amplifier having compensation for varying loads such as impedance variations due to antenna location in a portable hand-held product.

BACKGROUND OF THE INVENTION

Portable hand-held devices such as telephones and two-way radios are subject to operation in various environments that can dramatically affect the immediate surroundings of the device's antenna. For example, a cellular telephone might be carried in a purse, held near the user's head, clipped on the user's belt or might simply be resting on a desk or car seat. In each case, the wide variations of antenna surroundings affects not only the antenna's radiation pattern, but also the antenna's characteristic impedance as seen by the device's radio frequency (RF) power amplifier (PA). Such impedance variations can and do seriously impact the transmission of power from the power amplifier to the antenna. As the antenna and the power amplifier become mismatched as a result of the antenna's surroundings, standing waves are created and power is reflected from the antenna back into the power amplifier. The result is that the power amplifier can become unstable, operate at significantly reduced efficiency, perform outside of design parameters or even draw excessive DC current which may result in damage to the power amplifier.

This problem has been addressed by use of an RF isolator circuit situated between the power amplifier and the antenna and/or by over-design of the RF power amplifier to protect it from unacceptable load conditions. The use of an isolator, however, can substantially impact the usable bandwidth of the power amplifier. Both solutions can add substantial expense to the transmitter circuitry.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
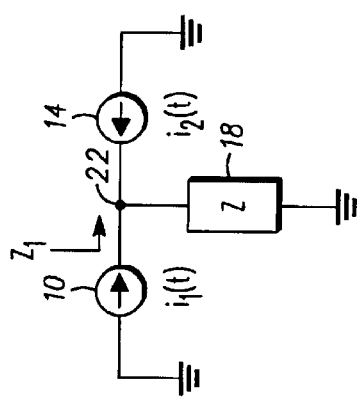
FIG. 1 is a circuit diagram illustrating a combination of signals producing a virtual impedance.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In order to understand the operation of the present invention, it is instructive to first consider the simple circuit as depicted in FIG. 1 in which a pair of current sources 10 and 14 are connected at node 22 to a load 18 having impedance Z. Under ideal conditions, the impedance $Z_1$ presented to current source 10 is given by:

$$Z_1 = Z[1 + (A_2 e^{-j\theta_2} / A_1 e^{-j\theta_1})] \quad \{eq.\ 1a\}$$

$$Z_1 = Z[1 + (A_2/A_1)(e^{j(\theta_1 - \theta_2)})] \quad \{eq.\ 1b\}$$

$$Z_1 = Z(1 + A_2/A_1[\cos(\theta_1 - \theta_2) + j\sin(\theta_1 - \theta_2)]) \quad \{eq.\ 1c\}$$

Where:

$A_1$ is the amplitude of $i_1(t)$;
$A_2$ is the amplitude of $i_2(t)$;
$\theta_1$ is the phase of $i_1(t)$; and
$\theta_2$ is the phase of $i_2(t)$.

If a desired value of $Z_1$ is a known resistive value R, the above equation 1 can be solved for the value of the current source $i_2(t)$ to allow for a given load impedance Z as:

$$i_2(t) = A_2 e^{j\theta(t)} = A_1((R/Z) - 1). \quad \{eq.\ 2\}$$

Thus, the impedance seen by current source 10 can be controlled by changing the current produced by current source 14. This concept of changing an impedance by changing a current or voltage is referred to herein as producing a "virtual impedance." By extension of this principle of virtual impedance, the load impedance presented to a distributed power amplifier can be controlled in accordance with the present invention.

Figure 2:
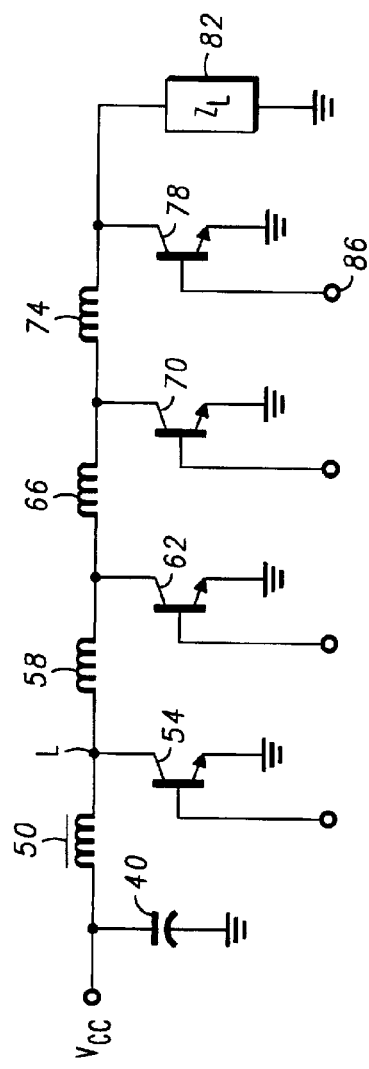
FIG. 2 is an exemplary circuit diagram of a distributed amplifier suitable for use with certain embodiments of the present invention.

Referring now to FIG. 2, an exemplary distributed amplifier is illustrated. In this embodiment, the amplifier has four stages, but in general an N stage amplifier can be used. In this amplifier, supply current is provided across filter capacitor 40 and through choke 50 to a first stage transistor 54's collector. Inductor 58 is used, in a known manner, to couple the collectors of transistor 54 and transistor 62 to resonate with the parasitic collector capacitances of transistors 54 and 62. These collector capacitances are a major limiting factor in the operational bandwidth of the transistors. Use of the coupling inductors, effectively creates a wide bandwidth lumped element transmission line to extend the operational frequency range of the transistors. In many distributed amplifier embodiments, a load is also connected from point "L" to RF ground in order to terminate both ends of the lumped element transmission line (the rightmost end of the line is already terminated with load $Z_L$ 82). The disadvantage of this configuration is that the impedances presented to the transistors 54, 62, 70, and 78 are not equivalent, and some of the amplifier's output power is dissipated as heat in the termination placed on the left end of the distributed amplifier.

In a similar manner as that used for coupling transistors 54 and 62, the collector of transistor 62 is coupled by inductor 66 to the collector of transistor 70, and an inductor 74 connects the collectors of transistors 70 and 78. The load $Z_L$ is from the collector of transistor 78 to RF ground. The emitters of each of transistors 54, 62, 70 and 78 are also coupled to RF ground. If inductors 58, 66 and 74 are chosen properly, as is known in the art, such that the transmission line impedance of each section decreases by the proper amount as one goes toward the output load $Z_L$ 82, then the impedance presented to each transistor 54, 62, 70 and 78 can be made equivalent so that each one delivers the same amount of current into the network. Similar arrangements can be devised with differential circuit configurations and/or use of field effect transistor embodiments.

The principle illustrated in connection with FIG. 1 resulting in equation 2 can be extended to the structure of FIG. 2, or generally to an N stage distributed amplifier arrangement. If one investigates the currents summing at each node of the distributed amplifier, one finds that the impedance presented to each device is a function of the current waveforms. This leads to the concept of altering the current waveforms in order to compensate for changes in environmental loading effects without having to resort to compensation by tunable components (varactors, pin diodes, etc.). In general, the current that should be produced at the collector of the final stage of the distributed amplifier (stage N) to cause the load impedance presented to each of the N−1 devices before the last stage to be the correct value of N·R is given by:

$$i_N(t) = A_N e^{j\Theta(t)} = A_O[N \cdot (R/Z_L) - N + 1] \quad \{eq. 3\}$$

where:

$i_N(t)$ is the current produced at the collector of the $N^{th}$ stage of the distributed amplifier;

N is the number of stages in the distributed amplifier;

$Z_L$ is the load impedance;

R is the desired load impedance; and $A_O$ is the amplitude of the collector current produced by each of the N−1 stages preceding the final stage of the distributed amplifier.

To obtain the above collector current, an input current is applied to the base of transistor 78 at terminal 86 having value:

$$I_{IN}(t) = (A_O/G) e^{j\Theta(t)} = (A_O/G)[N \cdot (R/Z_L) - N + 1] \quad \{eq. 4\}$$

Where:

G is the complex current gain of transistor 78.

Those skilled in the art will recognize that the above equation 3 is substantially simplified due to the assumption that each of the N−1 stages preceding the output stage N produce the same collector current. However, the present invention can also be embodied in implementations that do not take advantage of this mathematical simplification, provided the additional complexity of the equation is not an issue. As the number of stages in the distributed amplifier increase, the derivation of equations describing the effects of modification of any one input current become successively more complex and tedious to derive. However, such derivations are well within the skill of one having ordinary skill in the art. Embodiments utilizing input current manipulation in multiple stages are, thus, readily derived are within the scope of the present invention. In such embodiments, it may be advantageous to use more of an empirical technique to correct for mismatched impedances using an iterative process of adjustment and measurement.

The above principle can be applied to a distributed radio frequency power amplifier circuit according to certain embodiments of the present invention. The distributed radio frequency amplifier drives an output load, such as an antenna. A drive signal synthesizer, having a plurality of outputs, drives the plurality of inputs to the distributed amplifier. Changes in load impedance are measured, e.g., using a directional coupler, and the measurement is used to change a drive signal produced by the drive signal synthesizer (or equivalently, to synthesize the drive signal) to compensate for the change in load impedance.

Figure 3:
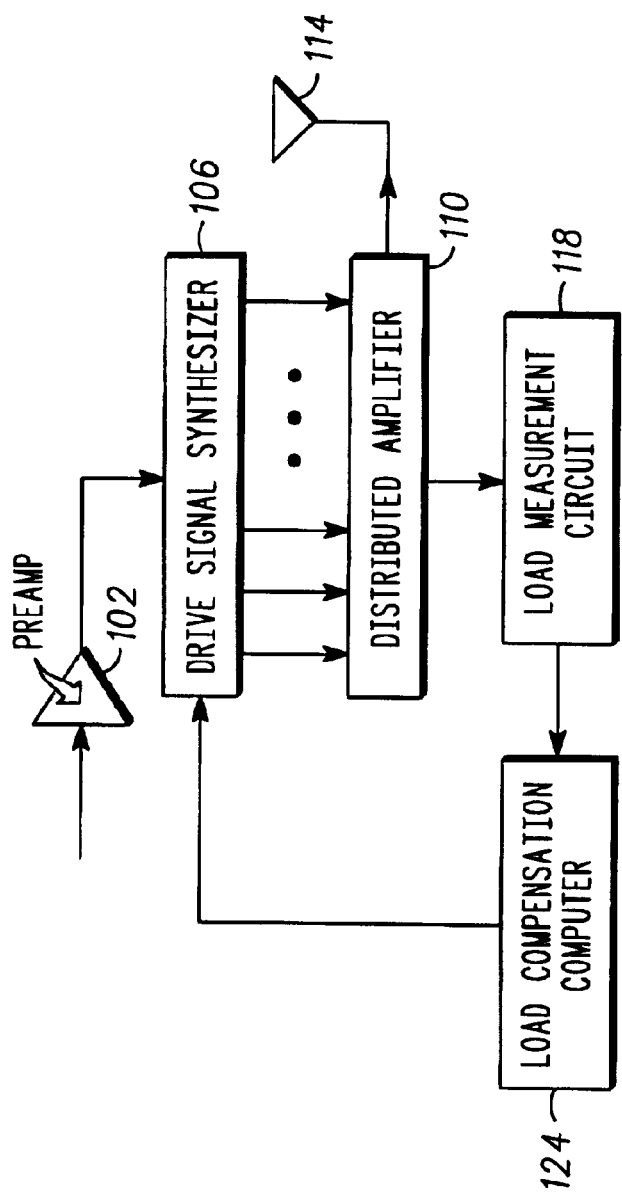
FIG. 3 is a block diagram of a distributed amplifier with load impedance compensation consistent with certain embodiments of the present invention.

Turning now to FIG. 3, an amplifier circuit is broadly depicted using the principles of the present invention. In this embodiment, the RF signal is provided from a preamplifier 102 to a drive signal synthesizer 106. The drive signal synthesizer 106 takes the output of the preamplifier 102 and creates signals to appropriately drive the inputs of a distributed amplifier 110. Distributed amplifier 110 drives a load such as antenna 114. In order to compensate for changes in the load, the drive signal synthesizer adjusts the drive signal applied as an input to the last stage of the distributed amplifier in accordance with load measurement from load measurement circuit 118 taken from an appropriate point in the distributed amplifier. This load measurement is converted to a load compensation using a load compensation computer 124 (which may be a main processor used in the device for multiple purposes or may be a dedicated processor). Compensation information is fed back to the drive signal synthesizer to produce an appropriate drive signal to the last ($N^{th}$) stage of the distributed amplifier 110 in this embodiment (or for use in generating any one or more drive signals in the general case).

In this embodiment, the load compensation is computed based upon minimizing equation 3 above for the current reflected back from the antenna 114. In other embodiments, other load measurement compensation calculations can be used. In other embodiments, the load impedance may be categorized and corrected using correction information stored in a look-up table that is indexed by the category of the load impedance.

While the above embodiment applies a load compensation to the drive signal applied to the last stage of the distributed amplifier 110, in other embodiments, compensation can be applied to one or more of the drive signals applied to any or all of the stages of the distributed amplifier without departing from the present invention. In fact, it has been determined that beyond a 2:1 VSWR window, the amount of current compensation necessary is beyond what might be practical or desirable for a single transistor stage. Thus, within a relatively small variation in load, one could compensate using only adjustment of the current to the final stage. With larger variations in load, compensate can be provided by decreasing the collector current for multiple stages.

Figure 4:
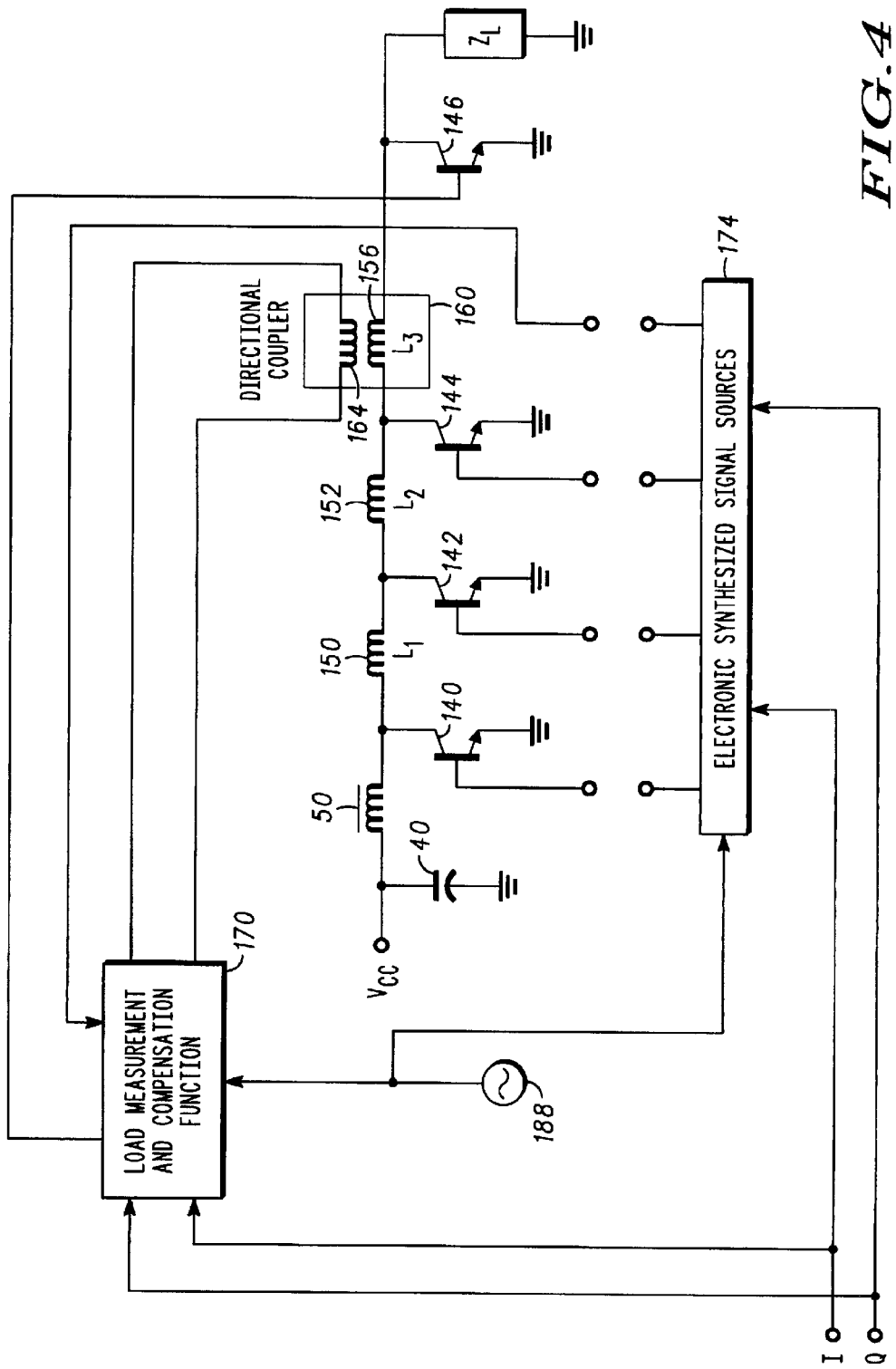
FIG. 4 is a circuit diagram of a distributed amplifier with load impedance compensation consistent with certain embodiments of the present invention.

FIG. 4 illustrates, in greater detail, an embodiment consistent with the present invention using a four stage distributed amplifier made up of transistors 140, 142, 144 and 146. Transistors 140 and 142 are connected by inductor 150. Transistors 142 and 144 are connected by inductor 152. Transistors 144 and 146 are connected by inductor 156, where inductor 156 is the primary side inductor of a directional coupler 160. The secondary side inductor 164 of directional coupler 160 provides an avenue for sampling and measurement of incident and reflected signals from the load $Z_L$ in a load measurement and compensation function 170 (e.g., a routine running on a programmed processor) so that a drive signal to transistor 146 can be generated.

The drive signals for the N−1 stages preceding the last stage (i.e., stages 1–3 in this example) are provided by synthesized signal sources 174. Synthesized signal sources 174 may, for example, be driven from quadrature and in-phase signals produced in a transmitter circuit along with a transmit local oscillator signal source 188.

In this embodiment, compensation of the input signal to the final stage of the distributed amplifier can be generated as illustrated using equation 3 above. However, in other embodiments, the other inputs to the N−1 stages can also be manipulated to compensate for changes in the load impedance.

The drive signal synthesizers shown in FIG. 3 (106) and FIG. 4 (174) show a general case in which a drive signal is synthesized for each transistor input. In some embodiments, it is only necessary to derive signals for the first and final stage of the distributed amplifier while the remaining stages need only be phase shifted versions of that required for the first stage.

Figure 5:
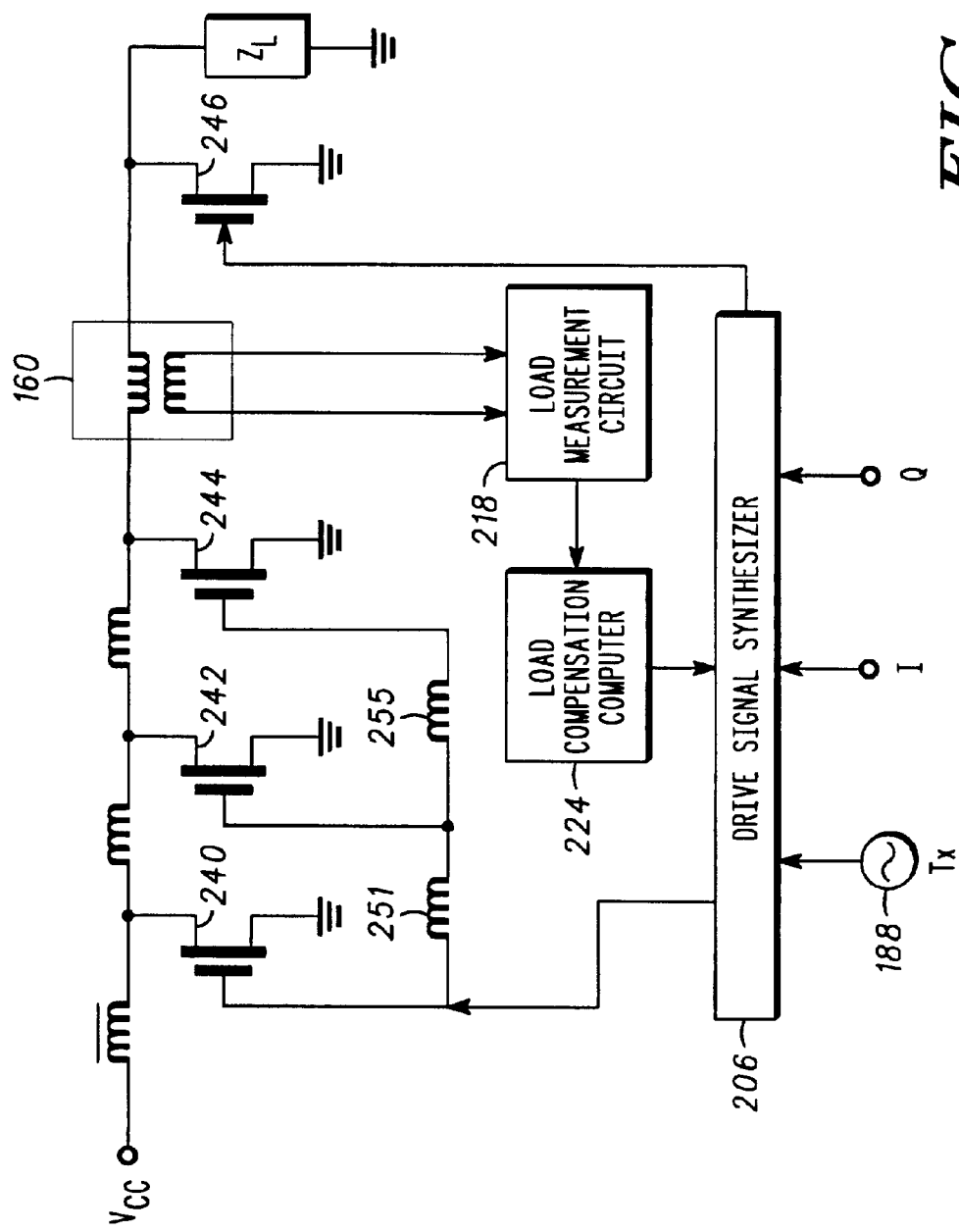
FIG. 5 is a circuit diagram of another embodiment of a distributed amplifier with load impedance compensation consistent with certain embodiments of the present invention.

FIG. 5 illustrates an embodiment of the present invention where a drive signal synthesizer 206 produces signals required to drive the first and last stage of the distributed amplifier (shown as the gates of FET transistors 240, and 246). Inputs to the intermediate stages formed by transistors 242 and 244 are provided by phase shifting the input to transistor 240 using lumped element transmission line sections 251 and 255 for creating the remaining input signals for the distributed amplifier. Drive signal synthesizer 206, therefore only generates two outputs to drive, either directly or indirectly, the four inputs (gates) of the four stages of the distributed amplifier. Load measurement circuit 218 again utilizes a directional coupler 160 to produce measurements representative of the changing load impedance $Z_L$ for delivery to load compensation computer 224. Drive signal synthesizer 206 again also receives as inputs a transmitter oscillator and in-phase and quadrature signals.

Many variations can be devised without departing from the present invention. For example, in other embodiments, a distributed amplifier implementation can be used in which two complementary paths are as illustrated in FIG. 2 are driven with signals 180 degrees out of phase and with the output signal applied across the load. In this embodiment, the impedance compensation is applied to both of the final devices in each half of the differential distributed amplifier. Ideally, each half of the differential amplifiers are identical, but compensation for any imbalance can be compensated for by modification of the signals applied for load variations. As described above, in other embodiments, the impedance compensation can be spread across the array of devices used in the distributed amplifier to reduce the impact on any one device and could be used to keep operating conditions similar for all devices.

In addition, although measurement of the changes in load impedance is illustrated using a directional coupler, other mechanisms can be used to measure changes in the output impedance without departing from the present invention.

Figure 6:
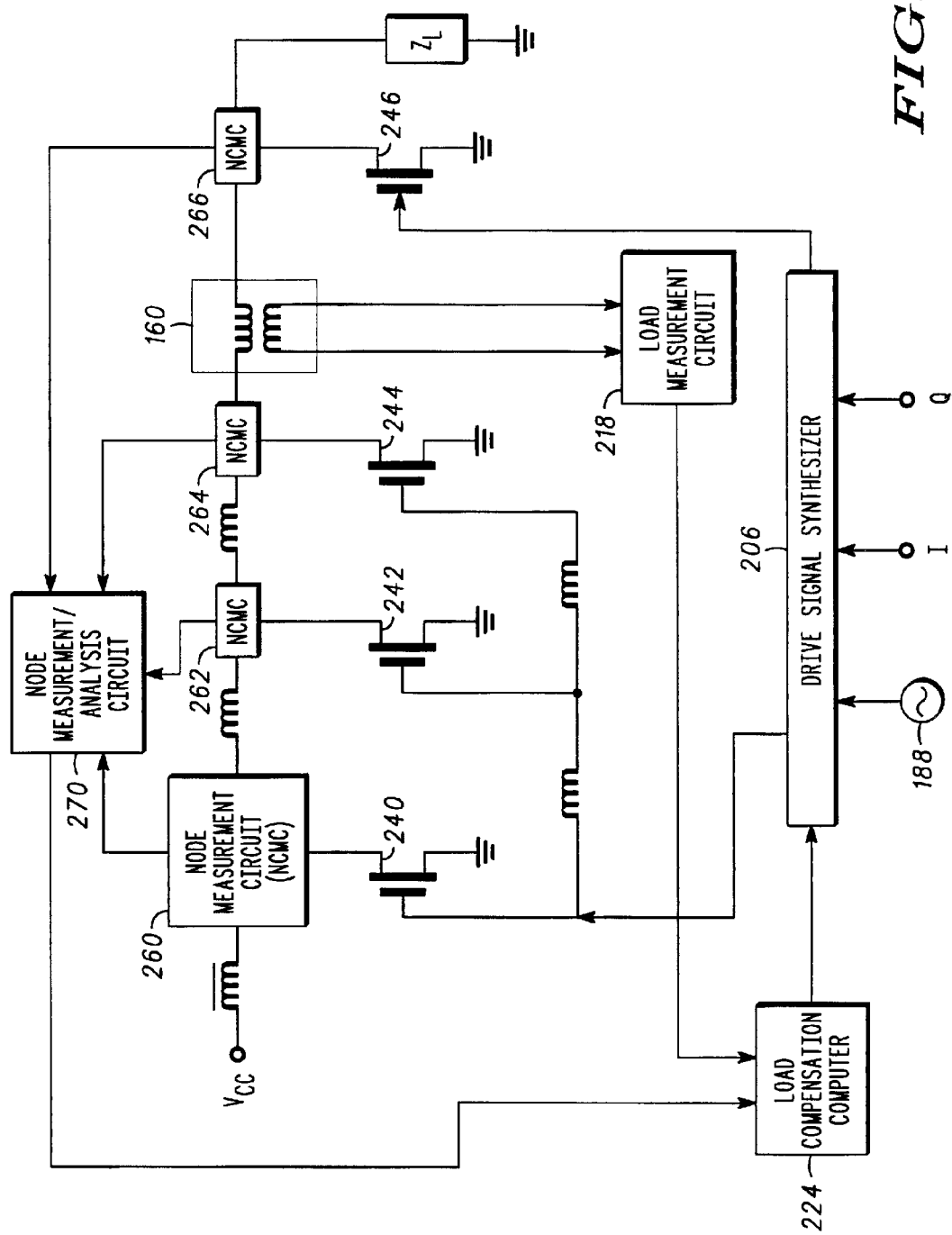
FIG. 6 is a circuit diagram of another embodiment of a distributed amplifier with load impedance compensation consistent with certain embodiments of the present invention.

In another embodiment of the present invention, conditions other than the load impedance may be measured as illustrated in FIG. 6. Circuitry may be included at each node in the circuit to measure the RF currents or RF voltages or DC voltages or currents such as node measurement circuits 260, 262, 264 and 266. These measurements can be collected at node measurement analysis circuit 270 which sends information to the load compensation computer 224. If the circuit is properly compensating for a load impedance which differs from the design value, the RF currents supplied by each stage preceding the final stage, and the DC currents consumed by each stage preceding the final stage, will be equivalent. As opposed to absolute measurements of any one of these voltage or currents, relative measurement techniques may be used in an iterative approach to balance the individual stages of the amplifier.

Figure 7:
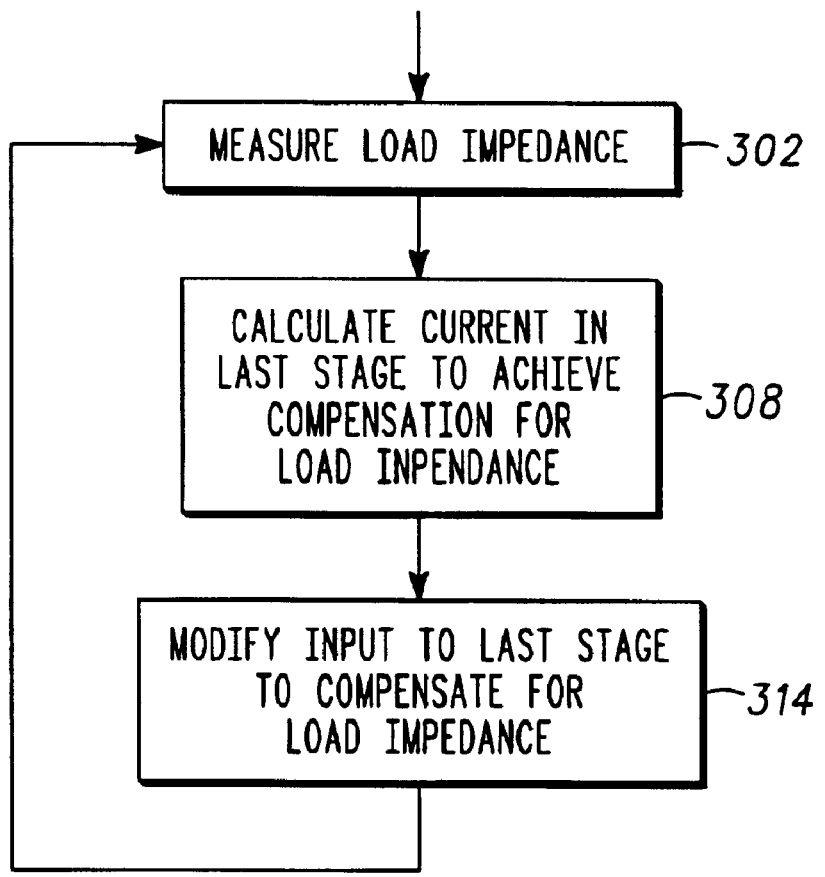
FIG. 7 is a flow chart depicting an exemplary process for load measurement and compensation consistent with certain embodiments of the present invention.

The load measurement and compensation function 170 can be carried out in any number of ways including, but not limited to, that illustrated in the flow chart of FIG. 7. In this exemplary process, the load impedance is measured at 302. This can be accomplished by direct or indirect measurements. At 308, the current required in the last stage to achieve compensation for the load impedance is calculated using equation 3 (assuming $A_O$ for the N−1 preceding stages, otherwise another equation is used to calculate adjustments to be made to one or more of the input signals). Once this desired current is calculated, the input signal to the last stage is modified to provide the impedance compensation at 314. The process then repeats at regular intervals. The interval of repetition should preferably be shorter than the time in which it is anticipated that substantial changes typically occur in load impedance. In the event more inputs than that of the final stage are to be adjusted, at 314 the inputs to all of the stages to be adjusted are modified. Of course, those skilled in the art will appreciate that any modifications made to the input of any stage of amplification to provide the compensation described herein is adjusted to compensate for the amplitude gain and phase shift inherent in the amplifier stage to produce the desired output. Thus if an amplifier stage has a current gain of G and a phase shift of $\phi$, and if the collector output current is to be adjusted to provide an output of $Re^{j\delta(t)}$, then the input to be applied is given by $(R/G)\ e^{j(\delta(t)-\phi)}$.

Although the present distributed amplifier has been shown with inductors coupling the transistor devices, those skilled in the art will understand that other reactive elements or the equivalent (e.g., transmission lines) can be used instead. Also, as previously mentioned, rather than rigorously calculating an input current for each impedance measurement, it may prove advantageous in some embodiments to simply categorize the change in load impedance or an equivalent figure of merit and use this information to address a lookup table to find a correction factor to apply to one or more input signals to the distributed amplifier. Other variations will occur to those skilled in the art.

Those skilled in the art will understand that the distributed amplifiers depicted herein are depicted in FIGS. 2 and 4 as using bipolar transistors. However, distributed amplifiers are commonly implemented using other types of transistors including field effect transistors as illustrated in FIGS. 5 and 6, gallium arsenide devices, etc. Such variations are equivalent and within the scope of the present invention.

Those skilled in the art will also recognize that the present invention has been described in terms of exemplary embodiments based upon use of a programmed processor to implement the load measurement and/or compensation. However, the invention should not be so limited, since the present invention could be implemented using hardware component equivalents such as special purpose hardware and/or dedicated processors that are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention. The programmed processor of embodiments herein execute programming instructions that are broadly described above which can be stored on any suitable electronic storage medium or transmitted over any suitable electronic communication medium.

Those skilled in the art will also recognize that the virtual impedance analysis can be implemented with voltage sources instead of current sources shown in FIG. 1. This will not change the results and is the dual of current analysis, which could favor voltage source implementation of distributed amplifiers.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A radio frequency amplifier apparatus, comprising:
   a distributed radio frequency amplifier having a plurality of stages, the distributed radio frequency amplifier having an output stage that drives a load, the load having a load impedance;
   a drive signal synthesizer driving the plurality of amplifier stages;
   means for measuring a circuit parameter indicative of the load impedance; and
   means responsive to the measuring means for changing a drive signal produced by the drive signal synthesizer to compensate for the change in load impedance.

2. The apparatus according to claim 1, wherein the means for measuring comprises a directional coupler.

3. The apparatus according to claim 2, wherein the distributed radio frequency amplifier has N stages, and wherein the directional coupler connects the $N^{th}$ stage with the $(N-1)^{st}$ stage.

4. The apparatus according to claim 2, wherein the means for measuring is implemented in a programmed processor coupled to the directional coupler to calculate the load impedance.

5. The apparatus according to claim 1, wherein the means for changing the drive signal is implemented in a programmed processor.

6. The apparatus according to claim 1, wherein the means for changing the drive signal changes a drive signal to the output stage.

7. The apparatus according to claim 6, wherein the drive signal to the output stage is changed to produce a current output from the last stage given by:

$$i_N = A_O(N \cdot (R/Z_L) - N + 1)$$

where:
   N is the number of stages in the distributed amplifier,
   $A_O$ is the amplitude of the current applied to the first N−1 stages of the distributed amplifier;
   R is the desired load impedance; and
   $Z_L$ is the measured load impedance.

8. The apparatus according to claim 1, wherein the means for changing the drive signal changes a plurality of drive signals to the distributed amplifier.

9. The apparatus according to claim 1, wherein the means for changing the drive signal comprises:
   means for categorizing the load impedance; and
   means for changing one or more drive signals to the distributed amplifier based upon the category of the load impedance.

10. The apparatus according to claim 9, wherein the category is used as an index to a look-up table to determine how to change the one or more drive signals.

11. The apparatus according to claim 1, wherein the distributed amplifier has N stages with the $N^{th}$ stage comprising the output stage, and wherein each stage has a transmission line impedance, and wherein the transmission line impedance of each stage decreases progressively from stage 1 to stage N.

12. The apparatus according to claim 1, wherein the circuit parameter comprises at least one of the following: a DC current, a DC voltage, an RF current, an RF voltage, a measure of reflected power, a measure of incident power, and a standing wave ratio.

13. The apparatus according to claim 1, wherein the distributed amplifier is fabricated from a plurality of junction transistors.

14. The apparatus according to claim 1, wherein the distributed amplifier is fabricated from a plurality of field effect transistors.

15. A radio frequency power amplifier apparatus, comprising:
   a distributed radio frequency amplifier having a plurality of N stages, the distributed radio frequency amplifier having an output at the $N^{th}$ stage that drives a load, the load having a load impedance;
   a drive signal synthesizer driving the plurality of amplifier stages;
   a directional coupler coupling the $N^{th}$ stage to the $(N-1)^{th}$ stage, and providing an coupler output for measuring a circuit parameter indicative of a change in the load impedance; and
   a programmed processor receiving the coupler output that computes a required change in drive signal to compensate for the change in load impedance, and which changes a drive signal produced by the drive signal synthesizer to compensate for the change in load impedance.

16. The apparatus according to claim 15, wherein the drive signal to the output stage is changed to produce a current output from the last stage given by:

$$i_N = A_O(N \cdot (R/Z_L) - N + 1)$$

where:
   N is the number of stages in the distributed amplifier,
   $A_O$ is the amplitude of the current applied to the first N−1 stages of the distributed amplifier;
   R is the desired load impedance; and
   $Z_L$ is the computed load impedance.

17. The apparatus according to claim 15, wherein the programmed processor categorizes the load impedance and changes one or more drive signals to the distributed amplifier based upon the category of the load impedance.

18. The apparatus according to claim 17, wherein the category is used as an index to a look-up table to determine how to change the one or more drive signals.

19. The apparatus according to claim 15, each stage of the distributed amplifier has a transmission line impedance, and wherein the transmission line impedance of each stage decreases progressively from stage 1 to stage N.

20. A radio frequency power amplifier apparatus, comprising:
   a distributed radio frequency amplifier having a plurality of stages each with an input, the distributed radio frequency amplifier having an output stage that drives a load, the load having a load impedance;
   a drive signal synthesizer driving the distributed amplifier;
   means for measuring a circuit parameter indicative of a change in the load impedance; and
   means responsive to the measuring means for changing a plurality of drive signals produced by the drive signal synthesizer to compensate for the change in load impedance.

21. The apparatus according to claim 20, wherein the means for measuring comprises a directional coupler.

22. The apparatus according to claim 21, wherein the distributed radio frequency amplifier has N stages, and wherein the directional coupler connects the $N^{th}$ stage with the $(N-1)^{st}$ stage.

23. The apparatus according to claim 21, wherein the means for measuring is implemented in a programmed processor coupled to the directional coupler to calculate the load impedance.

24. The apparatus according to claim 20, wherein the means for changing the drive signal is implemented in a programmed processor.

25. The apparatus according to claim 20, wherein the means for changing the drive signals comprises:
   means for categorizing the load impedance; and
   means for changing the drive signals to the distributed amplifier based upon the category of the load impedance.

26. The apparatus according to claim 25, wherein the category is used as an index to a look-up table to determine how to change the one or more drive signals.

27. The apparatus according to claim 20, wherein the circuit parameter comprises at least one of the following: a DC current, a DC voltage, an RF current, an RF voltage, a measure of reflected power, a measure of incident power, and a standing wave ratio.

28. A method of compensating for load impedance in an N stage distributed amplifier, comprising:
   measuring a circuit parameter indicative of a change in a load impedance;
   calculating a current required from a last stage of the distributed amplifier to make the load impedance appear to be a desired impedance; and
   applying an input to the last stage of the distributed amplifier to achieve the calculated current from the last stage of the distributed amplifier.

29. The method according to claim 28, wherein the input to the last stage produces a current output from the last stage given by:

$$i_N = A_O(N \cdot (R/Z_L) - N + 1)$$

where:
   N is the number of stages in the distributed amplifier,
   $A_O$ is the amplitude of the current applied to the first N-1 stages of the distributed amplifier;
   R is the desired load impedance; and
   $Z_L$ is the measured load impedance.

30. The method according to claim 28, wherein the load impedance is measured using a directional coupler.

31. The method according to claim 30, wherein the distributed amplifier has N stages, and wherein the directional coupler connects the $N^{th}$ stage with the $(N-1)^{st}$ stage.

32. The method according to claim 30, wherein the directional coupler is coupled to a programmed processor and wherein the programmed processor calculates the load impedance.

33. The method according to claim 28, wherein the calculating comprises categorizing the load impedance; and
   wherein the applying comprises changing the drive signal to the last stage of the distributed amplifier based upon the category of the load impedance.

34. The method according to claim 33, wherein the category is used as an index to a look-up table to determine how to change the one or more drive signals.

35. The method according to claim 28, wherein the circuit parameter comprises at least one of the following: a DC current, a DC voltage, an RF current, an RF voltage, a measure of reflected power, a measure of incident power, and a standing wave ratio.

36. A method of compensating for an output load impedance in an N stage distributed amplifier, comprising:
   measuring a circuit parameter indicative of the output load impedance in the distributed amplifier;
   calculating one or more input signals to the N stage distributed amplifier to make a stage's load impedance appear to be a desired impedance; and
   applying the one or more calculated input signals to the N stage distributed amplifier to make the stage's load impedance for at least one of the stages from stage 1 to stage N be the desired impedance.

37. The method according to claim 36, wherein the output load impedance is measured using a directional coupler.

38. The method according to claim 37, wherein the directional coupler connects the $N^{th}$ stage with the $(N-1)^{st}$ stage.

39. The method according to claim 36, wherein the directional coupler is coupled to a programmed processor and wherein the programmed processor calculates the output load impedance.

40. The method according to claim 36, wherein calculating comprises categorizing the output load impedance; and
   wherein the applying comprises changing the drive signal to the last stage of the distributed amplifier based upon the category of the output load impedance.

41. The method according to claim 40, wherein the category is used as an index to a look-up table to determine how to change the one or more drive signals.

42. The method according to claim 36, wherein the circuit parameter comprises at least one of the following: a DC current, a DC voltage, an RF current, an RF voltage, a measure of reflected power, a measure of incident power, and a standing wave ratio.

* * * * *